US012677419B2

(12) United States Patent
Kwak et al.

(10) Patent No.: US 12,677,419 B2
(45) Date of Patent: Jul. 7, 2026

(54) MEMORY INCLUDING MEMORY CELLS HAVING DIFFERENT SIZES

(71) Applicant: SK hynix Inc., Gyeonggi-do (KR)

(72) Inventors: Dong Hun Kwak, Gyeonggi-do (KR);
Moon Soo Sung, Gyeonggi-do (KR);
Woo Pyo Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 386 days.

(21) Appl. No.: 18/326,024

(22) Filed: May 31, 2023

(65) Prior Publication Data

US 2024/0284670 A1    Aug. 22, 2024

(30) Foreign Application Priority Data

Feb. 20, 2023    (KR) ........................ 10-2023-0022197

(51) Int. Cl.
| | |
|---|---|
| *G11C 16/24* | (2006.01) |
| *G11C 16/04* | (2006.01) |
| *G11C 16/26* | (2006.01) |
| *H10B 41/10* | (2023.01) |
| *H10B 41/27* | (2023.01) |
| *H10B 41/35* | (2023.01) |
| *H10B 43/10* | (2023.01) |
| *H10B 43/27* | (2023.01) |
| *H10B 43/35* | (2023.01) |

(52) U.S. Cl.
CPC ......... *H10B 43/27* (2023.02); *G11C 16/0483* (2013.01); *G11C 16/24* (2013.01); *G11C 16/26* (2013.01); *H10B 41/10* (2023.02); *H10B*

*41/27* (2023.02); *H10B 41/35* (2023.02);
*H10B 43/10* (2023.02); *H10B 43/35* (2023.02)

(58) Field of Classification Search
CPC ................................ G11C 16/26; G11C 16/24
See application file for complete search history.

(56) References Cited

U.S. PATENT DOCUMENTS

| | | | | |
|---|---|---|---|---|
| 8,918,577 | B1 * | 12/2014 | Gorobets | ............ G11C 11/5621 |
| | | | | 711/102 |
| 9,218,881 | B2 * | 12/2015 | Yang | .................. G11C 16/0483 |
| 9,543,022 | B2 | 1/2017 | Hashimoto et al. | |
| 9,721,670 | B1 * | 8/2017 | Kim | ...................... G11C 11/413 |
| 11,462,275 | B2 * | 10/2022 | Kim | ...................... H10B 43/27 |
| 2008/0062763 | A1 * | 3/2008 | Park | .................. G11C 16/0408 |
| | | | | 365/185.11 |
| 2015/0262689 | A1 * | 9/2015 | Hashimoto | ............ G11C 16/26 |
| | | | | 365/185.11 |
| 2020/0066752 | A1 * | 2/2020 | Lee | ........................ H10B 43/27 |
| 2020/0335166 | A1 * | 10/2020 | Piccardi | ............ G11C 16/0483 |
| 2020/0402586 | A1 * | 12/2020 | Moschiano | ............ G11C 16/12 |
| 2021/0248094 | A1 * | 8/2021 | Norman | ................ G06F 9/4403 |

(Continued)

FOREIGN PATENT DOCUMENTS

KR    10-2021-0060853 A    5/2021

*Primary Examiner* — Amir Zarabian
*Assistant Examiner* — Anthony Thinh Tang
(74) *Attorney, Agent, or Firm* — IP & T GROUP LLP

(57) ABSTRACT

A memory may include a first memory block including a plurality of first memory cells; and a second memory block including a plurality of second memory cells each having a larger size than each of the plurality of first memory cells. Normal data may be stored in the first memory block, and critical data requiring reliability may be stored in the second memory block.

18 Claims, 12 Drawing Sheets

(56)     References Cited

U.S. PATENT DOCUMENTS

| 2022/0050640 A1* | 2/2022 | Jung | ................... | G11C 16/0483 |
| 2022/0068402 A1* | 3/2022 | Yamada | ................. | G11C 16/32 |
| 2022/0284933 A1* | 9/2022 | Park | .................... | G11C 11/5642 |

* cited by examiner

MEMORY INCLUDING MEMORY CELLS HAVING DIFFERENT SIZES

CROSS-REFERENCE TO RELATED APPLICATION

This application claims priority under 35 U.S.C. § 119 to Korean Patent Application No. 10-2023-0022197 filed on Feb. 20, 2023, which is incorporated herein by reference in its entirety.

BACKGROUND

1. Technical Field

Embodiments of the present disclosure relate to an integrated circuit technology, and more particularly, to a memory.

2. Related Art

The degree of integration of a memory is mainly determined according to an area occupied by a unit memory cell. Recently, as the improvement in the degree of integration of a memory for forming memory cells in a single layer on a substrate reaches a limit, a three-dimensional memory for stacking memory cells on a substrate has been proposed. Furthermore, in order to improve the operational reliability of such a memory, various structures and manufacturing methods have been developed.

SUMMARY

In an embodiment of the present disclosure, a memory may include: a first memory block including a plurality of first memory cells; and a second memory block including a plurality of second memory cells each having a size larger than each of the plurality of first memory cells, wherein normal data may be stored in the first memory block, and critical data requiring reliability may be stored in the second memory block.

In an embodiment of the present disclosure, a memory may include: first memory strings each including a plurality of first memory cells; second memory strings including a plurality of second memory cells each having a size larger than each of the plurality of first memory cells; first bit lines connected to the first memory strings; and second bit lines connected to the second memory strings, wherein during a read operation, voltage levels of the first bit lines and voltage levels of the second bit lines may be differently controlled.

DETAILED DESCRIPTION

Various embodiments of the present disclosure are directed to improving the structure and operational reliability of a memory.

It is possible to efficiently improve the structure of a memory and improve the operational reliability thereof.

Hereafter, embodiments in accordance with the technical spirit of the present disclosure will be described with reference to the accompanying drawings.

Figure 1:
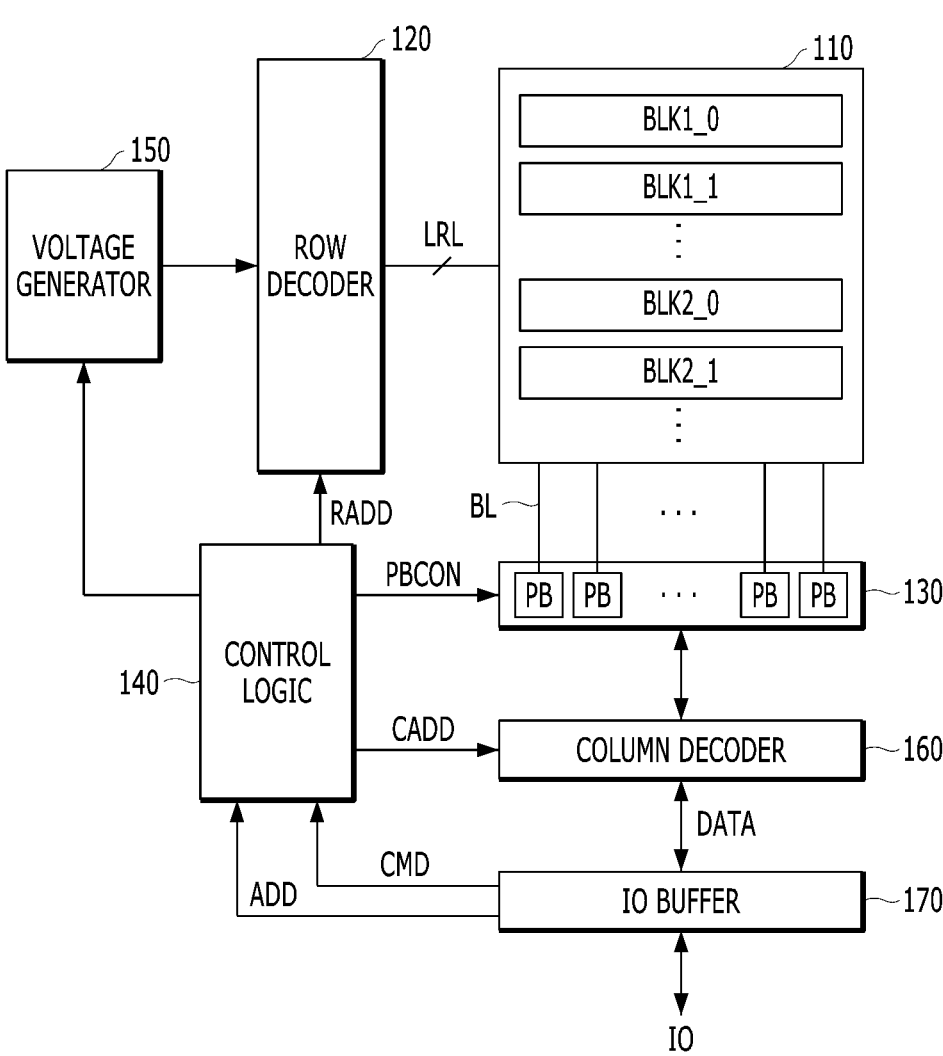
FIG. 1 is a configuration diagram of a memory in accordance with an embodiment of the present disclosure.

FIG. 1 is a configuration diagram of a memory in accordance with an embodiment of the present disclosure.

Referring to FIG. 1, the memory may include a cell array 110, a row decoder 120, a page buffer circuit 130, a control logic 140, a voltage generator 150, a column decoder 160, and an input/output (IO) buffer 170.

The cell array 110 may include a plurality of first memory blocks BLK1_0 and BLK1_1 and a plurality of second memory blocks BLK2_0 and BLK2_1. Each of the memory blocks BLK1_0, BLK1_1, BLK2_0, and BLK2_1 may include a plurality of memory strings. Each of the memory strings may include a plurality of memory cells stacked on a substrate. In an example, the memory cells may be nonvolatile memory cells. The memory strings of the first memory blocks BLK1_0 and BLK_1 and the memory strings of the second memory blocks BLK2_0 and BLK2_1 may be different in at least one of the shapes and sizes thereof. For example, the memory strings of the second memory blocks BLK2_0 and BLK2_1 may have larger sizes than the memory strings of the first memory blocks BLK1_0 and BLK1_1.

The cell array 110 may be connected to the row decoder 120 through local row lines LRL. The local row lines LRL may include at least one drain select line, a plurality of word lines, and at least one source select line. The cell array 110 may be connected to the page buffer circuit 130 through bit lines BL. The local row lines LRL may be provided for each of the memory blocks BLK1_0, BLK1_1, BLK2_0, and BLK2_1. The local row line LRL of a memory block selected from among the memory blocks BLK1_0, BLK1_1, BLK2_0, and BLK2_1 may be electrically connected to global row lines GRL of the row decoder 120 and controlled.

The bit lines BL may be connected in common to the memory blocks BLK1_0, BLK1_1, BLK2_0, and BLK2_1.

The row decoder 120 may decode a row address RADD transferred from the control logic 140, and select one of the memory blocks BLK1_0, BLK1_1, BLK2_0, and BLK2_1 of the cell array 110. The row decoder 120 may transfer an operating voltage provided from the voltage generator 150 to the local row lines LRL of the selected memory block.

The page buffer circuit 130 may include a plurality of page buffers PB connected to the cell array 110 through the bit lines BL. The page buffers PB may operate as write drivers or sense amplifiers according to an operation mode. During a program operation, the page buffers PB may latch data DATA transferred through the IO buffer 170 and the column decoder 160, and apply a voltage required for storing the data DATA in the selected memory cells to the bit lines BL in response to a page buffer control signal PBCON from the control logic 140. During a read operation, the page buffers PB may read the data DATA stored in the selected memory cells through the bit lines BL, and output the read data DATA to the outside of the memory through the column decoder 160 and the IO buffer 170. During an erase operation, the page buffers PB may float the bit lines BL of the memory cell array 110.

The control logic 140 may transfer to the row decoder 120, a row address RADD among addresses ADD received through the IO buffer 170, and transfer a column address CADD to the column decoder 160. The control logic 140 may control the page buffer circuit 130 and the voltage generator 150 to access selected memory cells in response to a command CMD received through the IO buffer 170. The control logic 140 may generate a page buffer control signal PBCON for controlling the page buffer circuit 130.

The voltage generator 150 may generate various voltages required by the memory. For example, the voltage generator 150 may be configured to generate program voltages, pass voltages, read voltages, and the like.

In response to the column address CADD from the control logic 140, the column decoder 160 may transfer the data DATA to the page buffer circuit 130 during a program operation and receive the data DATA from the page buffer circuit 130 during a read operation.

The memory strings in the first memory blocks BLK1_0 and BLK1_1 of the cell array 110 may each have a relatively small size. That is, the memory cells of the first memory blocks BLK1_0 and BLK1_1 may each have a size smaller than those of the second memory blocks BLK2_0 and BLK2_1. On the other hand, the memory strings included in the second memory blocks BLK2_0 and BLK2_1 may each have a relatively large size. That is, the memory cells of the second memory blocks BLK2_0 and BLK2_1 may each have a size larger than those of the first memory blocks BLK1_0 and BLK1_1. The size of the memory cell is very critical for cell characteristics, and the larger the size of the memory cell, the better the cell characteristics. That is, data stored in the large-sized memory cells may be more reliable.

For this reason, different types of data may be stored in the first memory blocks BLK1_0 and BLK1_1 and the second memory blocks BLK2_0 and BLK2_1. Normal data may be stored in the first memory blocks BLK1_0 and BLK1_1, and critical data requiring reliability may be stored in the second memory blocks BLK2_0 and BLK2_1. The critical data may include meta data, boot data used for system booting, setting data, buffer data for a buffering operation for improving performance, and the like. The normal data may mean general data other than the critical data.

The number of stored data bits per memory cell may be different between the first memory blocks BLK1_0 and BLK1_1 and the second memory blocks BLK2_0 and BLK2_1. For example, since relatively uncritical normal data is stored in the first memory blocks BLK1_0 and BLK1_1, 3-bit data may be stored in each memory cell of the first memory blocks BLK1_0 and BLK1_1. Since the critical data is stored in the second memory blocks BLK2_0 and BLK2_1, 1-bit data may be stored in each memory cell of the second memory blocks BLK2_0 and BLK2_1 for the purpose of reliability. In contrast, since the memory cells of the first memory blocks BLK1_0 and BLK1_1 are small in size, data with a small number of bits may be stored in each memory cell of the first memory blocks BLK1_0 and BLK1_1. Since the memory cells of the second memory blocks BLK2_0 and BLK2_1 are large in size, data with a large number of bits may be stored in each memory cell of the second memory blocks BLK2_0 and BLK2_1.

Table 1 below shows differences between the first memory blocks BLK1_0 and BLK1_1 and the second memory blocks BLK2_0 and BLK2_1. The expressions in Table 1 below are relative expressions. For example, the fact that the memory cell size of the first memory block is small may mean that it is relatively smaller than the size of the memory cell of the second memory block, but may not mean that the size of the memory cell is absolutely small.

TABLE 1

|  | First memory block | Second memory block |
| --- | --- | --- |
| Memory cell size | Small | Large |
| Cell characteristics | Bad | Good |
| Stored data | Normal data | Critical data |
| Number of bits of stored data per cell | Large | Small |

Figure 2A:
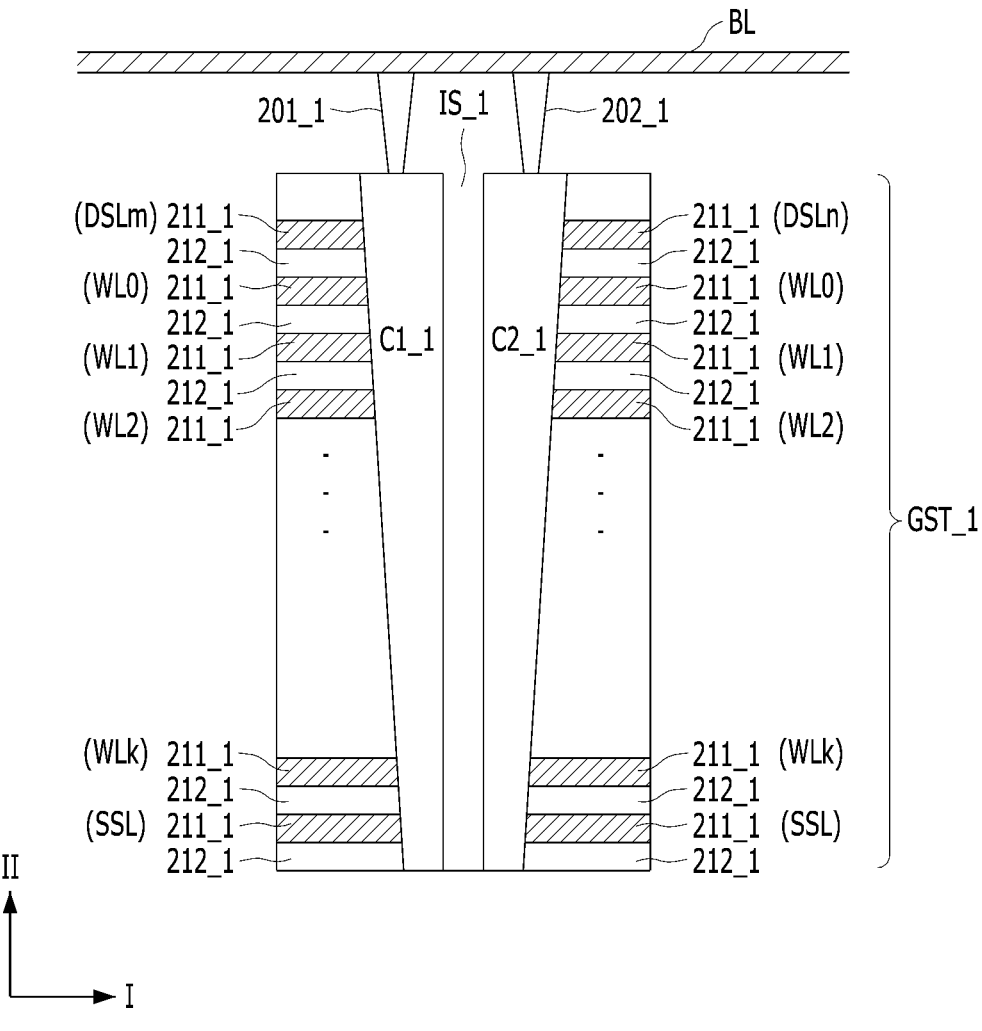
FIG. 2A is a diagram illustrating the structure of a memory string included in a first memory block BLK1_$i$ in accordance with an embodiment of the present disclosure.

FIG. 2A is a diagram illustrating the structure of a memory string included in a first memory block BLK1_i, where i is an arbitrary integer, in accordance with an embodiment of the present disclosure. In the illustrated example, FIG. 2A illustrates a pair of memory strings.

Referring to FIG. 2A, the pair of memory strings may include a gate structure GST_1, a first channel layer C1_1, a second channel layer C2_1, an isolation structure IS_1, contact plugs 201_1 and 202_1, and a bit line BL.

The gate structure GST_1 may include conductive layers 211_1 and insulating layers 212_1 that are alternately stacked. The conductive layers 211_1 may be gate lines such as word lines WL and select lines DSL and SSL. In an example, among the conductive layers 211_1, at least one lowermost conductive layer 211_1 may be a source select line SSL, at least one uppermost conductive layer 211_1 may be a drain select line DSL, and the other conductive layers 211_1 may be the word lines WL. The source select line SSL and the word line WL may be the same lines in the same layer. However, the drain select lines DSL may be lines in which a drain select line DSLm on the left side and a drain select line DSLn on the right side in the drawing are electrically isolated from each other.

The first channel layer C1_1 and the second channel layer C2_1 may be located within an opening of the gate structure GST_1. The channel layers C1_1 and C2_1 may each have a shape in which the opening (channel hole) of the gate structure GST_1 is isolated. The channel hole may be isolated by the isolation structure IS_1 to become the first channel layer C1_1 and the second channel layer C2_1 that are electrically isolated.

At least one source select transistor, a plurality of memory cells, and at least one drain select transistor may be formed along the first channel layer C1_1. That is, one memory string may be formed along the first channel layer C1_1. Furthermore, at least one source selection transistor, a plurality of memory cells, and at least one drain selection transistor may be formed along the second channel layer C2_1. That is, one memory string may be formed along the second channel layer C2_1. Since the drain select lines DSLm and DSLn for selecting the first channel layer C1_1 and the second channel layer C2_1 are electrically isolated, the first channel layer C1_1 and the second channel layer C2_1 may operate independently.

The contact plug 201_1 may connect the first channel layer C1_1 to the bit line BL, and the contact plug 202_1 may connect the second channel layer C2_1 to the bit line BL.

Figure 2B:
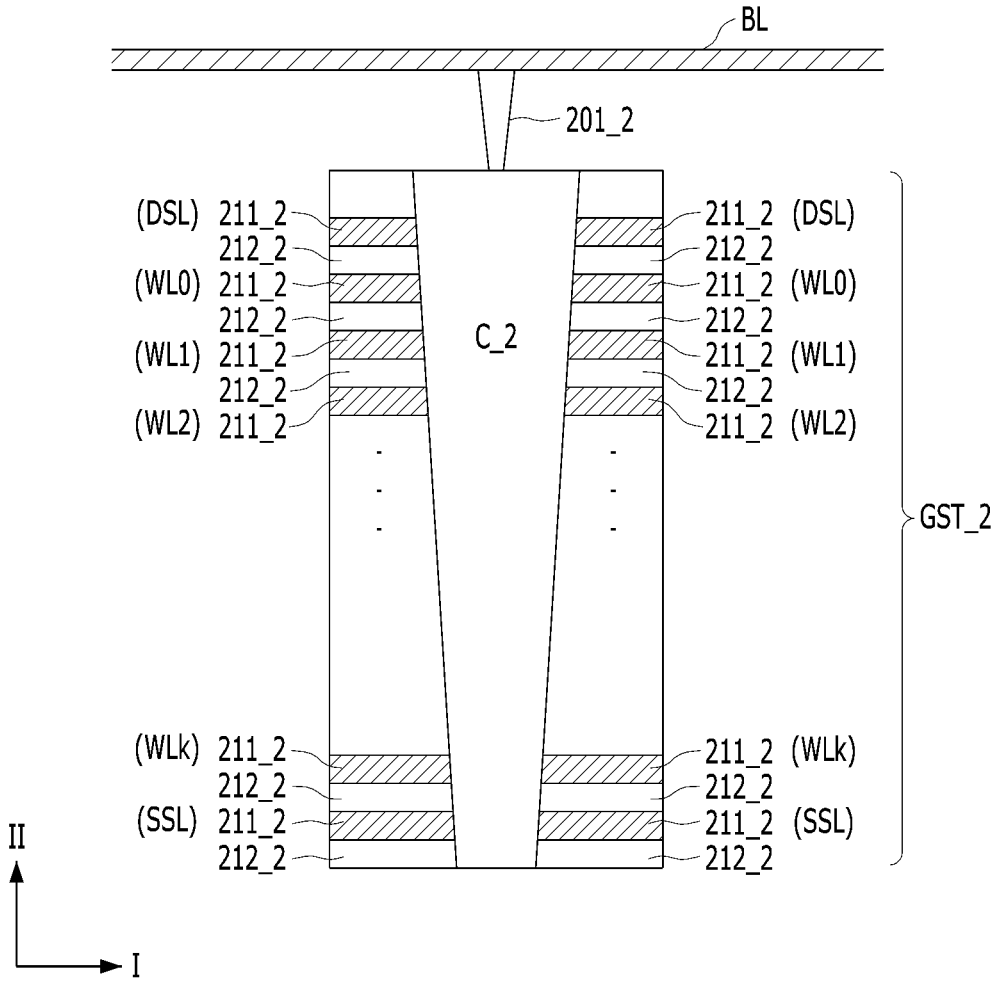
FIG. 2B is a diagram illustrating the structure of a memory string included in a second memory block BLK2_$j$ in accordance with an embodiment of the present disclosure.

FIG. 2B is a diagram illustrating the structure of a memory string included in a second memory block BLK2_j, where j is an arbitrary integer, in accordance with an embodiment of the present disclosure. In the illustrated example, FIG. 2B illustrates one memory string.

Referring to FIG. 2B, the memory string may include a gate structure GST_2, a channel layer C_2, a contact plug 201_2, and a bit line BL.

The gate structure GST_2 may include conductive layers 211_2 and insulating layers 212_2 that are alternately stacked. The conductive layers 211_2 may be gate lines such as word lines WL and select lines DSL and SSL. In an example, among the conductive layers 211_2, at least one lowermost conductive layer 211_2 may be a source select line SSL, at least one uppermost conductive layer 211_2 may be a drain select line DSL, and the other conductive layers 211_2 may be the word lines WL. The source select line SSL, the word line WL, and the drain select line DSL may be the same lines in the same layer.

The channel layer C_2 may be located in an opening of the gate structure GST_2. Since the channel layer C_2 of the second memory block BLK2_j is formed without isolating the opening (channel hole) of the gate structure GST_2, the channel layer C_2 may be formed to be larger than the channel layers C1_1 and C2_1 of the first memory block BLK1_i in which the opening (channel hole) is isolated to form two channel layers.

At least one source select transistor, a plurality of memory cells, and at least one drain select transistor may be formed along the channel layer C_2. That is, one memory string may be formed along the channel layer C_2.

The contact plug 201_2 may connect the channel layer C_2 to the bit line BL.

Figure 3:
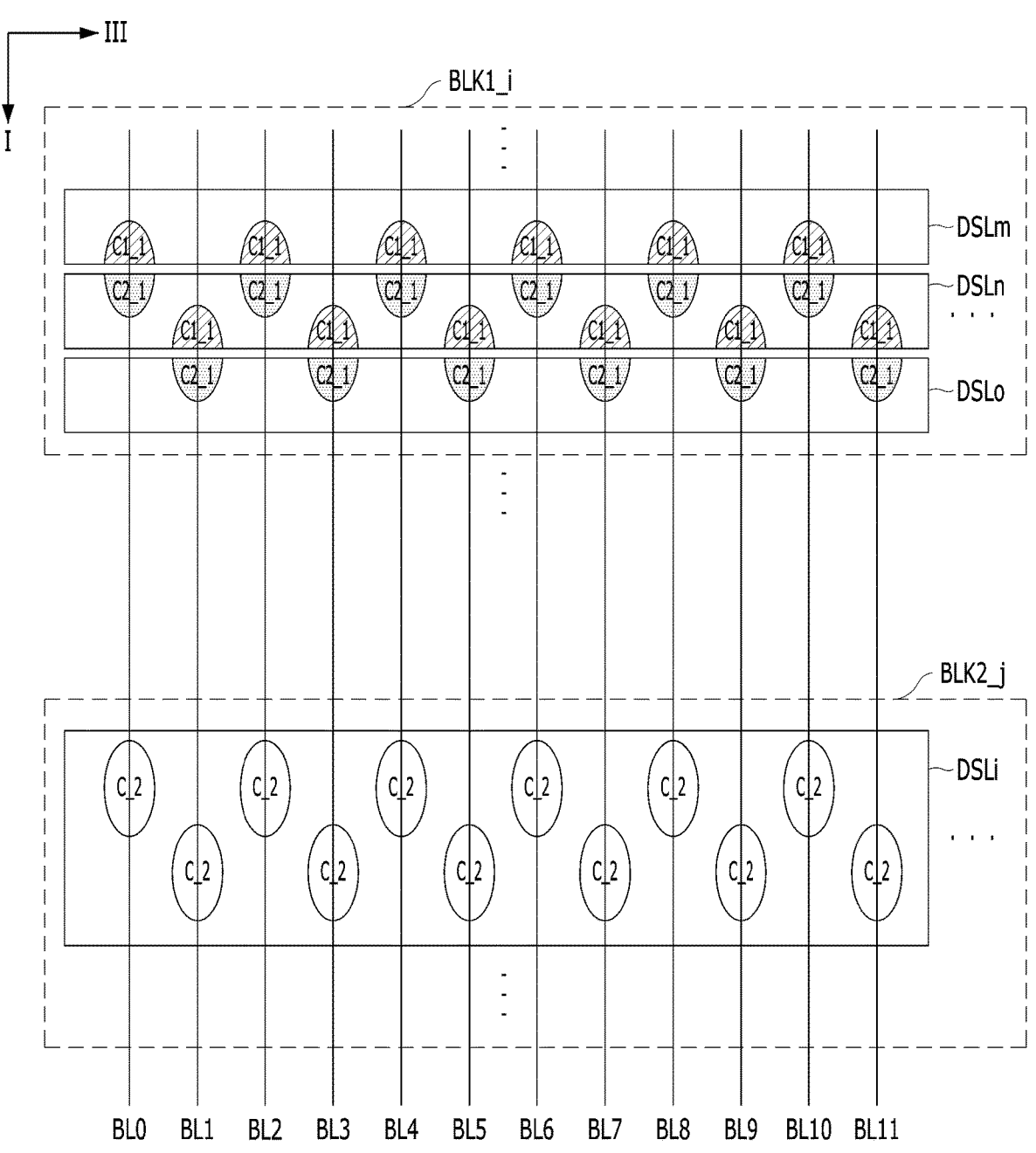
FIG. 3 is a top view of the structure of a memory string in FIG. 2A and FIG. 2B in accordance with an embodiment of the present disclosure.

FIG. 3 is a top view of the structure of memory strings in memory blocks of FIGS. 2A and 2B in accordance with an embodiment of the present disclosure.

In the illustrated example, FIG. 3 illustrates the channel layers C1_1 and C2_1 of the first memory block BLK1_i and the channel layers C_2 of the second memory block BLK2_j. In FIG. 3, a third direction III may be orthogonal to a plane defined by a first direction I and a second direction II in FIG. 2A and FIG. 2B.

As illustrated in FIG. 3, channel layers may be located at intersections of bit lines BL0 to BL11 and drain select lines DSLm, DSLn, DSLo, and DSLi. The channel layers will be described based on the bit line BL0. When the drain select line DSLm is activated, the leftmost channel layer corresponding to the drain select line DSLm among the channel layers C1_1 of the first memory block BLK1_i may be connected to the bit line BL0. When the drain select line DSLn is activated, the leftmost channel layer corresponding to the drain select line DSLn among the channel layers C2_1 of the first memory block BLK1_i may be connected to the bit line BL0. When the drain select line DSLi is activated, the leftmost channel layer among the channel layers C_2 of the second memory block BLK2_j may be connected to the bit line BL0.

Figure 4:
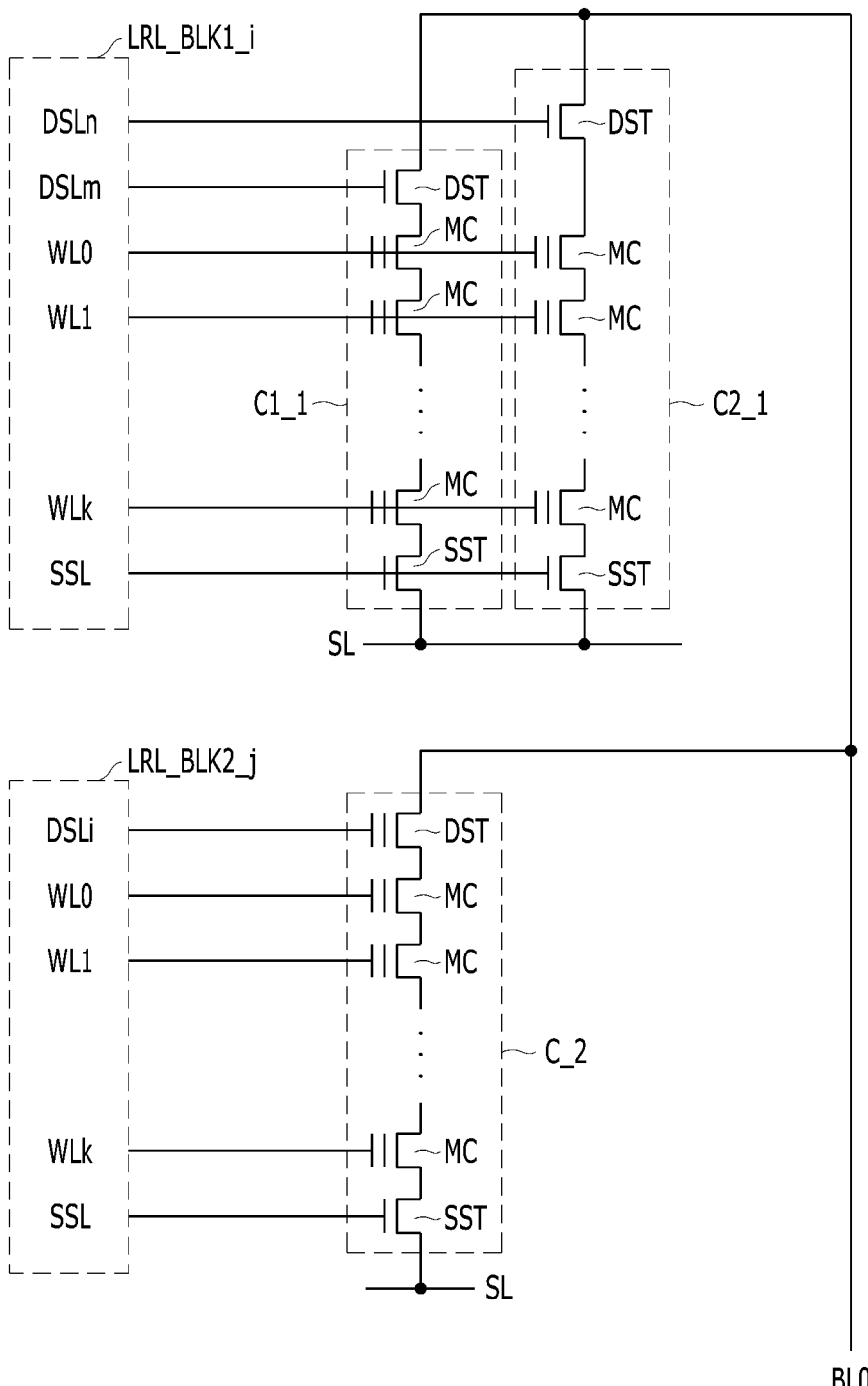
FIG. 4 is a circuit diagram of channel layers connected to a bit line in a first memory block and a second memory block of FIG. 3 in accordance with an embodiment of the present disclosure.

FIG. 4 is a circuit diagram of the channel layers C1_1, C2_1, and C_2 connected to the bit line BL0 in the first memory block BLK1_i and the second memory block BLK2_j of FIG. 3 in accordance with an embodiment of the present disclosure.

Referring to FIG. 4, a memory string corresponding to the memory strings C1_1 of the first memory block BLK1_i is denoted by C1_1, and a memory string corresponding to the memory strings C2_1 thereof is denoted by C2_1. Each of the memory strings may include a source select transistor SST connected between a source line SL and a bit line BL0, memory cells MC, and a drain select transistor DST. The memory strings C1_1 and C2_1 are controlled by the same source select line SSL and word lines WL0 to WLk. Since the drain select lines DSLm and DSLn are isolated, one memory string selected from the memory strings C1_1 and C2_1 may be accessed by being connected to the bit line BL0. Local row lines for controlling the memory strings C1_1 and C2_1 are indicated by LRL_BLK1_i.

The memory string C_2 of the second memory block BLK2_j may include a source select transistor SST connected between the source line SL and the bit line BL0, memory cells MC, and a drain select transistor DST. Local row lines for controlling the memory string C_2 are indicated by LRL_BLK2_j.

Figure 5:
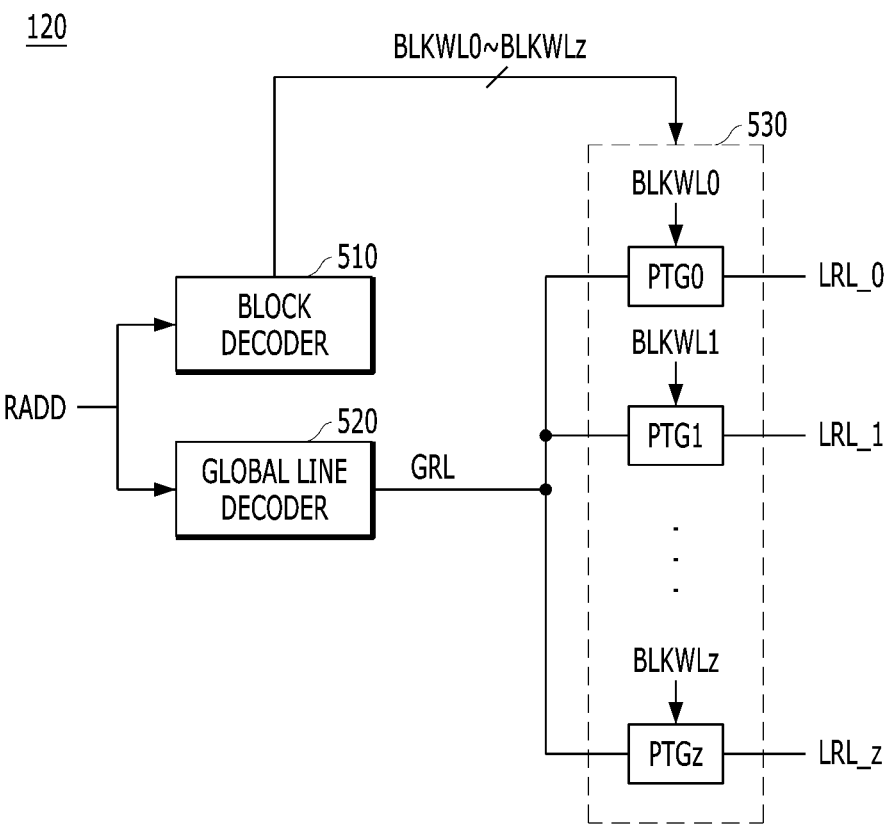
FIG. 5 is a configuration diagram of a row decoder of FIG. 1 in accordance with an embodiment of the present disclosure.

FIG. 5 is a configuration diagram of the row decoder 120 of FIG. 1 in accordance with an embodiment of the present disclosure.

Referring to FIG. 5, the row decoder 120 may include a block decoder 510, a global line decoder 520, and a pass transistor circuit 530.

The block decoder 510 may decode a row address RADD to generate block word line signals BLKWL0 to BLKWLz. The block word line signals BLKWL0 to BLKWLz may be used to select the local row lines LRL of which of the memory blocks of the cell array 110, which are to be connected to the global row lines GRL. That is, the block word line signals BLKWL0 to BLKWLz may have information on a selected memory block among the memory blocks of the cell array 110.

The global line decoder 520 may drive the global row lines GRL. The global line decoder 520 may decode the row address RADD to determine which word line is selected from global word lines GWL and which drain select line is selected from the drain select lines DSL, and drive the global row lines GRL accordingly.

The pass transistor circuit 530 may connect the global row lines GRL to the local row lines LRL in response to the block word lines BLKWL0 to BLKWLz. The pass transistor circuit 530 may include pass transistor groups PTG0 to PTGz corresponding to the memory blocks, respectively. When the block word line BLKWL0 is activated, since pass transistors of the pass transistor group PTG0 are turned on, the global row lines GRL may be connected to local row lines LRL_0. Similarly, when the block word line BLKWLz is activated, since pass transistors of the pass transistor group PTGz are turned on, the global row lines GRL may be connected to local row lines LRL_z.

Figure 6:
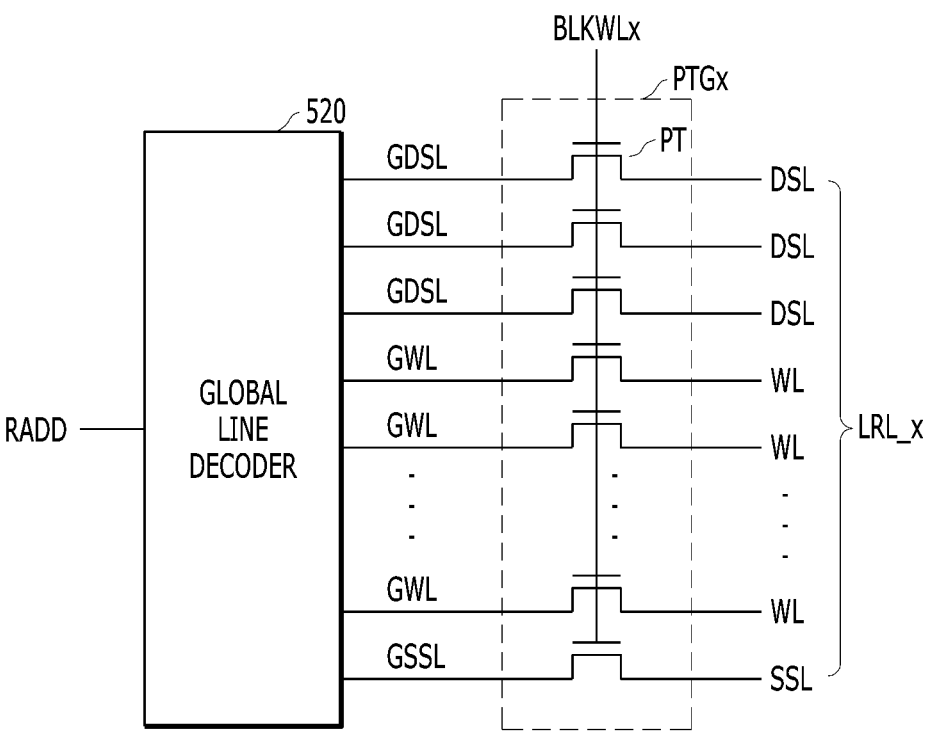
FIG. 6 is a more detailed diagram of a global line decoder and one PTGx of pass transistor groups of a pass transistor circuit in a row decoder of FIG. 5 in accordance with an embodiment of the present disclosure.

FIG. 6 is a more detailed diagram of the global line decoder 520 and one PTGx of the pass transistor groups of the pass transistor circuit 530 in the row decoder 120 of FIG. 5, where x is an integer from 0 to z, in accordance with an embodiment of the present disclosure.

Referring to FIG. 6, the global line decoder 520 may drive a global row line GRL including global drain select lines GDSL (e.g., three in FIG. 6, but the number of global drain select lines GDSL may be different), global word lines GWL, and a global source select line GSSL. The pass transistors PT of the pass transistor group PTGx may electrically connect the global row line GRL and the local row line LRL_x in response to the voltage level of the block word line BLKWLx.

Physical sizes of the drain select lines DSL may vary depending on whether a memory block corresponding to the local row line LRL_x is the first memory block BLK1 or the second memory block BLK2. Referring back to FIG. 3, it can be seen that the drain select lines DSLm, DSLn, and DSLo of the first memory block BLK1 each have a small size, but the drain select line DSLi of the second memory block BLK2 has a large size. This may mean that the capacitance of the drain select line DSLi of the second memory block BLK2 is greater than the capacitance of each of the drain select lines DSLm, DSLn, and DSLo of the first memory block BLK1.

Since the memory string of the first memory block BLK1 has a smaller size than the memory string of the second memory block BLK2, the amount of cell current of the memory string of the first memory block BLK1 may be less than that of the memory string of the second memory block BLK2.

In order to compensate for the difference in the physical size of the drain select line DSL between the first memory block BLK1 and the second memory block BLK2 and the amount of cell current between the first memory block BLK1 and the second memory block BLK2, the following methods (1) and (2) may be used.

(1) The global line decoder 520 may differently drive the drain select line DSL according to whether a selected memory block is the first memory block BLK1 or the second memory block BLK2.

Figure 7:
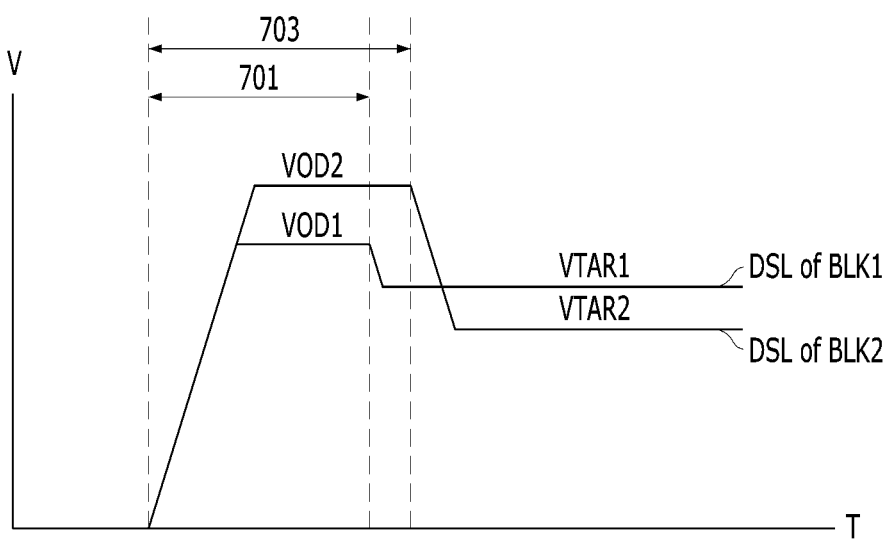
FIG. 7 is a diagram illustrating that a global line decoder drives a drain select line selected through a global drain select line in accordance with an embodiment of the present disclosure.

FIG. 7 is a diagram illustrating that the global line decoder 520 drives a drain select line DSL selected through the global drain select line GDSL in accordance with an embodiment of the present invention. Referring to FIG. 7, when the first memory block BLK1 is selected, the global line decoder 520 may overdrive the drain select line DSL of the first memory block BLK1 to the level of an overdriving voltage VOD1 during a period 701, and drive the drain select line DSL of the first memory block BLK1 to the level of an activation voltage VTAR1 after the period 701. When the second memory block BLK2 is selected, the global line decoder 520 may overdrive the drain select line DSL of the second memory block BLK2 to the level of an overdriving voltage VOD2 during a period 703, and drive the drain select line DSL of the second memory block BLK2 to the level of an activation voltage VTAR2 after the period 703.

It can be seen that when the second memory block BLK2 is selected, the drain select line DSL is overdriven for a longer period (i.e., 703 is longer than 701) and is overdriven to a higher voltage level (i.e., VOD2 is higher than VOD1) than when the first memory block BLK1 is selected. This compensates for the fact that the physical size of the drain select line DSL of the second memory block BLK2 is larger and the capacitance is higher. When the capacitance of the line is high, the voltage of the line does not change easily, and thus the drain select line DSL of the second memory block BLK2 may be overdriven to the higher voltage level VOD2 for a longer period 703. On the other hand, it can be seen that the activation voltage level VTAR of the drain select line DSL is higher when the first memory block BLK1 is selected (VTAR1) than when the second memory block BLK2 is selected (VTAR2). This compensates for the insufficient amount of cell current by more strongly turning on the drain select transistor of the memory string because the amount of cell current in the first memory block BLK1 is less than that in the second memory block BLK2.

(2) The pass transistor PT corresponding to the drain select line DSL of the first memory block BLK1 and the pass transistor PT corresponding to the drain select line DSL of the second memory block BLK2 may have different sizes.

Pass transistors corresponding to the drain select line DSL among the pass transistors PT in pass transistor groups corresponding to the first memory block BLK1 among the pass transistor groups PTG0 to PTGz may be formed in a large size. Pass transistors corresponding to the drain select line DSL among the pass transistors PT in pass transistor groups corresponding to the second memory block BLK2 among the pass transistor groups PTG0 to PTGz may be formed in a small size. Through this, the drain select transistor DST of the first memory block BLK1 may be strongly turned on compared to the drain select transistor DST of the second memory block BLK2, and as a result, the insufficient amount of cell current of the first memory block BLK1 may be compensated for.

Figure 8:
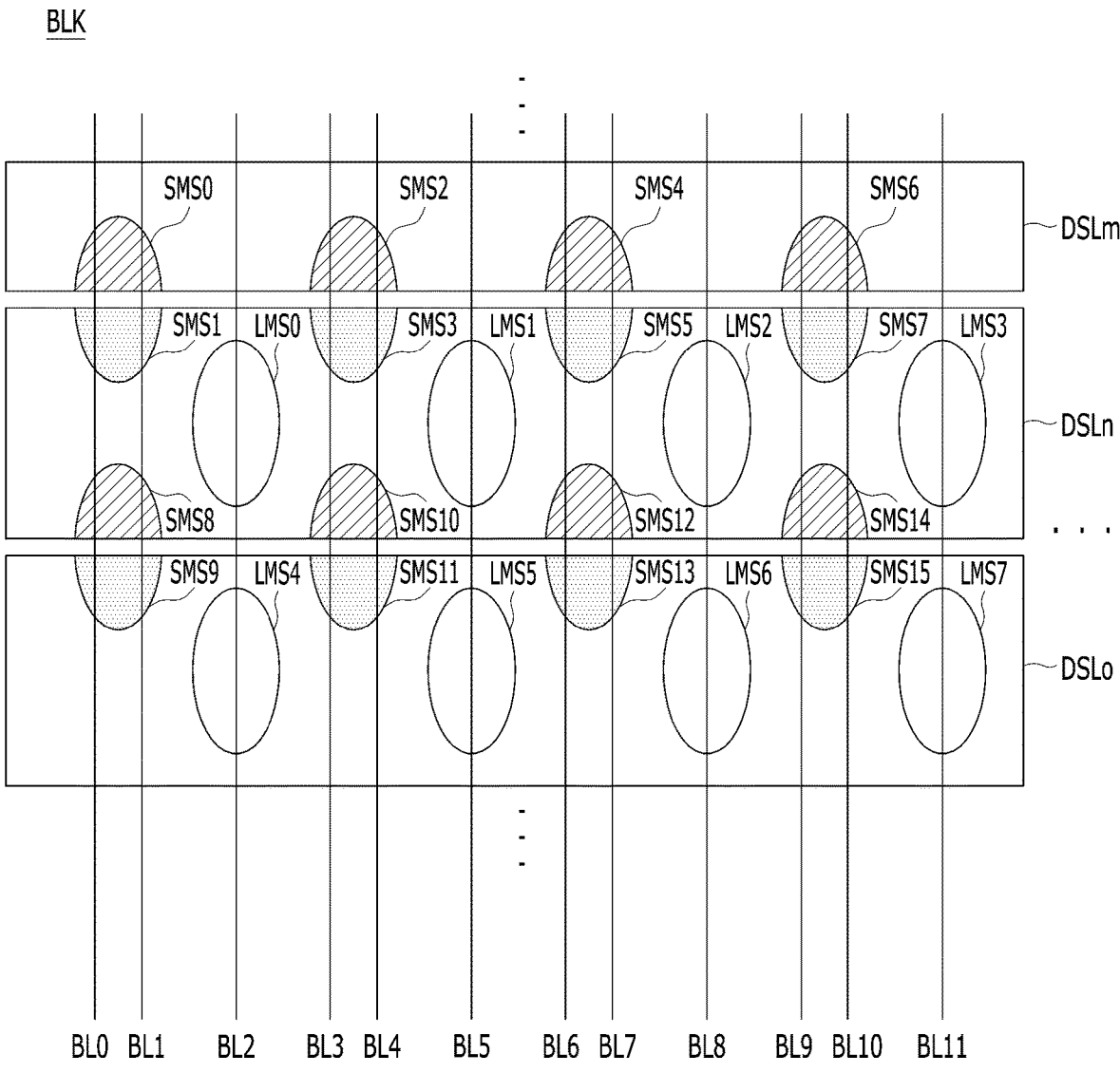
FIG. 8 is a configuration diagram of a memory block in accordance with an embodiment of the present disclosure.

FIG. 8 is a configuration diagram of the memory block BLK in accordance with an embodiment of the present disclosure.

The memory block BLK of FIG. 8 may include small memory strings SMS and large memory strings LMS. FIG. 8 is a top view of the memory block BLK, and it can be seen that a pair of small memory strings SMS and one large memory string LMS are arranged to intersect each other in a zig-zag pattern for efficient arrangement. Each of the small memory strings SMS may have a structure as illustrated in FIG. 2A, and each of the large memory strings LMS may have a structure as illustrated in FIG. 2B.

A pair of small memory strings (for example, SMS0 and SMS1) may be connected to different bit lines. For example, the small memory string SMS0 may be connected to a bit line BL0 and the small memory string SMS1 may be connected to a bit line BL1. Similarly, small memory strings SMS2, SMS4, SMS6, SMS8, SMS10, SMS12, and SMS14 may be connected to bit lines crossing themselves among bit lines BL0, BL3, BL6, and BL9, and small memory strings SMS3, SMS5, SMS7, SMS9, SMS11, SMS13, and SMS15 may be connected to bit lines crossing themselves among bit lines BL1, BL4, BL7, and BL10. The large memory strings LMS0 to LMS7 may be connected to bit lines crossing themselves among bit lines BL2, BL5, BL8, and BL11.

When the drain select line DSLn is activated, the small memory string SMS8 may be connected to the bit line BL0, the small memory string SMS1 may be connected to the bit line BL1, the large memory string LMS0 may be connected to the bit line BL2, the small memory string SMS10 may be connected to the bit line BL3, the small memory string SMS3 may be connected to the bit line BL4, the large memory string LMS1 may be connected to the bit line BL5, the small memory string SMS12 may be connected to the bit line BL6, the small memory string SMS5 may be connected to the bit line BL7, the large memory string LMS2 may be connected to the bit line BL8, the small memory string SMS14 may be connected to the bit line BL9, the small memory string SMS7 may be connected to the bit line BL10, and the large memory string LMS3 may be connected to the bit line BL11.

Similarly, when the drain select line DSLo is activated, the small memory string SMS9 may be connected to the bit line BL1, the large memory string LMS4 may be connected to the bit line BL2, the small memory string SMS11 may be connected to the bit line BL4, the large memory string LMS5 may be connected to the bit line BL5, the small memory string SMS13 may be connected to the bit line BL7, the large memory string LMS6 may be connected to the bit line BL8, and the small memory string SMS15 may be connected to the bit line BL10, and the large memory string LMS7 may be connected to the bit line BL11.

Since there is a size difference between the small memory strings SMS and the large memory strings LMS, the amount of cell current of the small memory strings SMS may be less than that of the large memory strings LMS. In order to compensate for this difference in the amount of cell current, the bit lines BL0, BL1, BL3, BL4, BL6, BL7, BL9, and BL10 corresponding to the small memory strings SMS and the bit lines BL2, BL5, BL8, and BL11 corresponding to the large memory strings LML may be controlled differently.

Figure 9:
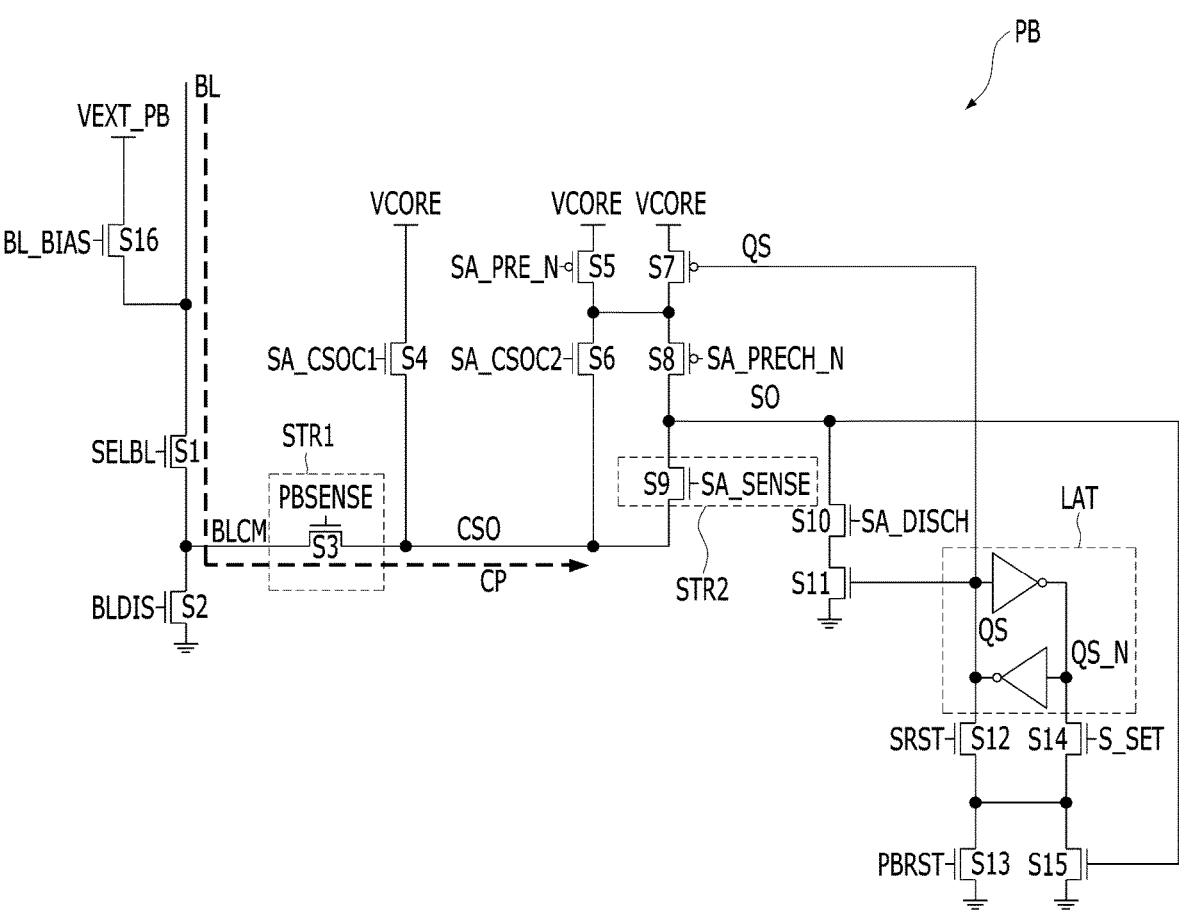
FIG. 9 is a configuration diagram of a page buffer connected to bit lines of FIG. 8 in accordance with an embodiment of the present disclosure.

FIG. 9 is a configuration diagram of a page buffer PB connected to the bit lines BL of FIG. 8 in accordance with an embodiment of the present disclosure.

Referring to FIG. 9, the page buffer PB may include first to sixteenth switches S1 to S16 and at least one latch LAT. Each of the switches S1 to S16 may be an NMOS transistor or a PMOS transistor. The latch LAT may include a plurality of inverters. The page buffer PB may include a bit line connection node BLCM, a first sensing node CSO, and a second sensing node SO. Hereinafter, a sensing method of the page buffer PB will be described based on signals applied to the switches S1 to S16.

The first switch S1 may be turned on or off in response to a bit line select signal SELBL. The bit line select signal SELBL may be one of page buffer control signals PBCON of FIG. 1. When the first switch S1 is turned on, the voltage of the bit line connection node BLCM may be transferred to the bit line BL, or the voltage or current of the bit line BL may be transferred to the bit line connection node BLCM.

The second switch S2 may connect or disconnect the bit line connection node BLCM to/from a ground terminal in response to a bit line discharge signal BLDIS. The bit line discharge signal BLDIS may be one of the page buffer control signals PBCON. When the second switch S2 is turned on, the bit line connection node BLCM may be connected to the ground terminal and may be discharged.

The third switch S3 may connect or disconnect the bit line connection node BLCM to/from the first sensing node CSO in response to a page buffer sensing signal PBSENSE. The page buffer sensing signal PBSENSE may be one of the page buffer control signals PBCON. The third switch S3 may be a first sensing transistor STR1. When the first switch S1 and the third switch S3 are turned on, a current path may be formed between the bit line BL and the first sensing node CSO.

The fourth switch S4 may connect or disconnect the first sensing node CSO to/from a core voltage terminal VCORE in response to a first common sensing control signal SA_CSOC1. The fifth switch S5 and the sixth switch S6 may connect the first sensing node CSO and the core voltage terminal VCORE in response to a first precharge signal SA_PRE_N and a second common sensing control signal SA_CSOC2, respectively. The seventh switch S7 may be controlled according to the potential of a first node QS. The eighth switch S8 may be controlled in response to a second precharge signal SA_PRECH_N. The first common sensing control signal SA_CSOC1, the first precharge signal SA_PRE_N, the second common sensing control signal SA_CSOC2, or the second precharge signal SA_PRECH_N may be one of the page buffer control signals PBCON.

The ninth switch S9 may be connected between the first sensing node CSO and the second sensing node SO. The ninth switch S9 may connect or disconnect the first sensing node CSO to/from the second sensing node SO in response to a sensing signal SA_SENSE. The ninth switch S9 may be a second sensing transistor STR2. The sensing signal SA_SENSE may be one of the page buffer control signals PBCON.

The tenth switch S10 may be turned on or off in response to a sensing node discharge signal SA_DISCH. The eleventh switch S11 may be turned on or off according to data stored in the first node QS. When the tenth switch S10 and the eleventh switch S11 are turned on, the second sensing node SO may be connected to the ground terminal and may be discharged.

The latch LAT may store data sensed through the bit line BL. Main data may be stored in the first node QS, and inverted data of the main data may be stored in a second node QS_N.

The twelfth switch S12 may be controlled in response to a sensing reset signal SRST. The thirteenth switch S13 may be controlled in response to a page buffer reset signal PBRST. The fourteenth switch S14 may be controlled in response to a sensing setup signal S_SET. The fifteenth switch S15 may be controlled in response to the voltage level of the second sensing node SO. The magnitude of the voltage level of the second sensing node SO may vary depending on a result of sensing a memory cell.

The sixteenth switch S16 may be controlled in response to a bit line bias signal BL_BIAS. When the sixteenth switch S16 is turned on, an external voltage may be transferred from an external voltage terminal VEXT_PB to the bit line BL.

A sensing operation based on the configuration of the page buffer PB described above is as follows. During a precharge period, the bit line BL may be precharged. The precharge voltage may be the external voltage VEXT_PB or the core voltage VCORE. In an example, the bit line BL may be precharged with the external voltage VEXT_PB by turning on the sixteenth switch S16. During the precharge period, the first sensing node CSO and the second sensing node SO may be precharged. In an example, by turning on the fifth switch S5, the eighth switch S8, and the ninth switch S9, the first sensing node CSO and the second sensing node SO may be precharged with the core voltage VCORE.

The voltage level of the external voltage VEXT_PB and the voltage level of the core voltage VCORE, which may be used for precharging the bit line BL, may be different from each other, and the precharge voltage level of the bit line BL may be adjusted using this difference. When the page buffer PB is one of page buffers connected to the bit lines BL0, BL1, BL3, BL4, BL6, BL7, BL9, and BL10 corresponding to the small memory strings SMS of FIG. 8, a higher voltage between the external voltage VEXT_PB and the core voltage VCORE may be used for bit line precharge in order to compensate for the insufficiency of the amount of cell current. On the other hand, when the page buffer PB is one of page buffers connected to the bit lines BL2, BL5, BL8, and BL11 corresponding to the large memory strings LMS of FIG. 8, since the amount of cell current is sufficient, a lower voltage between the external voltage VEXT_PB and the core voltage VCORE may be used for bit line precharge.

During an evaluation period, the bit line BL and the sensing node may be connected to each other in a state in which a read voltage is applied to a selected word line and a pass voltage is applied to unselected word lines. The bit line BL and the sensing node may be electrically connected to each other by turning on a sensing transistor. In an example, the bit line BL and the first sensing node CSO may be electrically connected to each other by turning on the first sensing transistor STR1. The bit line BL and the second sensing node SO may be electrically connected to each other by turning on the first sensing transistor STR1 and the second sensing transistor STR2.

Due to this, a current path CP may be formed between the bit line BL and the sensing node. The resistance of the current path CP may vary depending on whether the page buffer PB corresponds to the small memory strings SMS or the large memory strings LMS. In both cases, the resistance of the current path CP may be changed by varying the turn-on voltage of at least one of the first sensing transistor STR1 and the second sensing transistor STR2.

In an example, the level of the page buffer sensing signal PBSENSE applied to the first sensing transistor STR1 may be changed. When the page buffer PB corresponds to the small memory strings SMS, a turn-on voltage having a first level may be applied to the first sensing transistor STR1. The resistance of the current path CP may be reduced by increasing the turn-on level of the page buffer sensing signal PBSENSE. Due to this, the bit line BL and the first sensing node CSO may be strongly connected to each other, and the flow of current may be increased. That is, the insufficiency of the amount of cell current may be compensated for. When the page buffer PB corresponds to the large memory strings LMS, a turn-on voltage having a second level lower than the first level may be applied to the first sensing transistor STR1. The resistance of the current path CP may be increased by reducing the turn-on level of the page buffer sensing signal PBSENSE. Due to this, the bit line BL and the first sensing node CSO may be weakly connected to each other, and the flow of current may be reduced.

In an example, the level of the sensing signal SA_SENSE applied to the second sensing transistor STR2 may be changed. When the page buffer PB corresponds to the small memory strings SMS, the turn-on voltage having the first level may be applied to the second sensing transistor STR2. The resistance of the current path CP may be reduced by increasing the turn-on level of the sensing signal SA_SENSE. Due to this, the bit line BL and the second sensing node SO may be strongly connected to each other, and the flow of current may be increased. When the page buffer PB corresponds to the large memory strings LMS, the turn-on voltage having the second level lower than the first level may be applied to the second sensing transistor STR2. The resistance of the current path CP may be increased by reducing the turn-on level of the sensing signal SA_SENSE. Due to this, the bit line BL and the second sensing node SO may be weakly connected to each other, and the flow of current may be reduced.

According to the operation method described above, the connection strength between the bit line and the sensing node can be adjusted during the evaluation period according to whether the page buffer PB corresponds to the small memory strings SMS or the large memory strings LMS. Consequently, even though the amount of cell current varies depending on the difference in the size of the memory string, it can be compensated for by changing the resistance of the current path CP.

Figure 10:
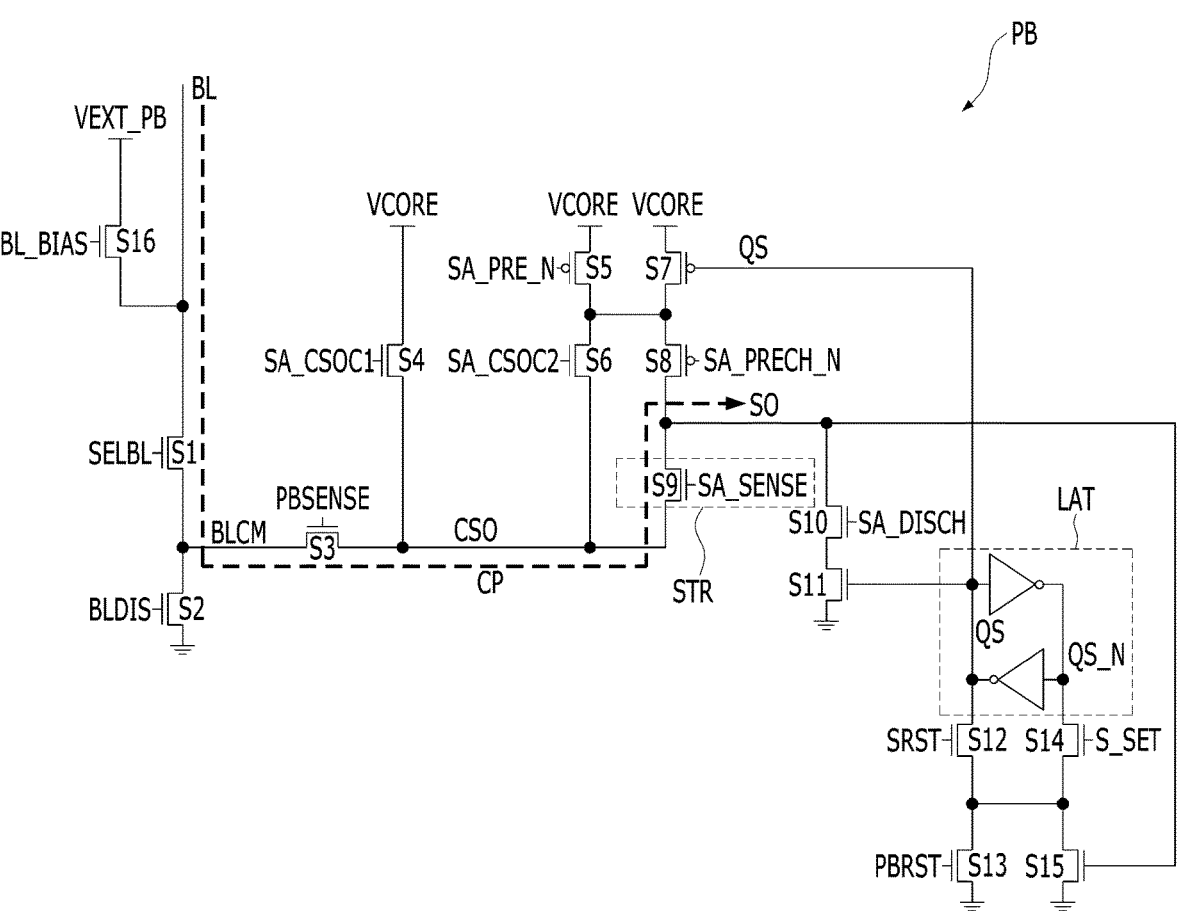
FIG. 10 is a diagram for describing another method for compensating for a difference in the amount of cell current due to a difference in the size of a memory string in accordance with an embodiment of the present disclosure.

FIG. 10 is a diagram for describing another method for compensating for a difference in the amount of cell current due to the difference in the size of a memory string in accordance with an embodiment of the present disclosure. Hereinafter, the content overlapping with the previously described content will be omitted.

Referring to FIG. 10, the page buffer PB may include the first to sixteenth switches S1 to S16 and at least one latch LAT. The page buffer PB may include the bit line connection node BLCM, the first sensing node CSO, and the second sensing node SO.

During an evaluation period, the bit line BL and the sensing node may be connected to each other in a state in which a read voltage is applied to a selected word line and a pass voltage is applied to unselected word lines. The ninth switch S9 may be a sensing transistor STR that connects the bit line BL and the sensing node in response to the sensing signal SA_SENSE. In an example, during a read operation, the third switch S3 may be kept turned on, and the ninth switch S9 may be turned on to generate a current path CP that connects the bit line BL and the second sensing node SO.

The length of the evaluation period may vary depending on whether the page buffer PB corresponds to the small memory strings SMS or the large memory strings LMS. By changing the control method of the sensing transistor STR, the length of the evaluation period may be changed according to the size of the memory string. In an example, the turn-off time point of the sensing transistor STR may be differently set depending on whether the page buffer PB corresponds to the small memory strings SMS or the large memory strings LMS. When the page buffer PB corresponds to the small memory strings SMS, the evaluation period may have a first length. When the page buffer PB corresponds to the large memory strings LMS, the evaluation period may have a second length smaller than the first length.

In an example, when the page buffer PB corresponds to the small memory strings SMS, the length of the evaluation period may be increased by delaying the turn-off time point of the sensing transistor STR. When the page buffer PB corresponds to the large memory strings LMS, the length of the evaluation period may be reduced by advancing the turn-off time point of the sensing transistor STR.

According to the operating method described above, the length of the evaluation period can vary depending on whether the page buffer PB corresponds to the small memory strings SMS or the large memory strings LMS. Consequently, even though the amount of cell current varies depending on the difference in the size of the memory string, it can be compensated for by changing the length of the evaluation period.

Figure 11:
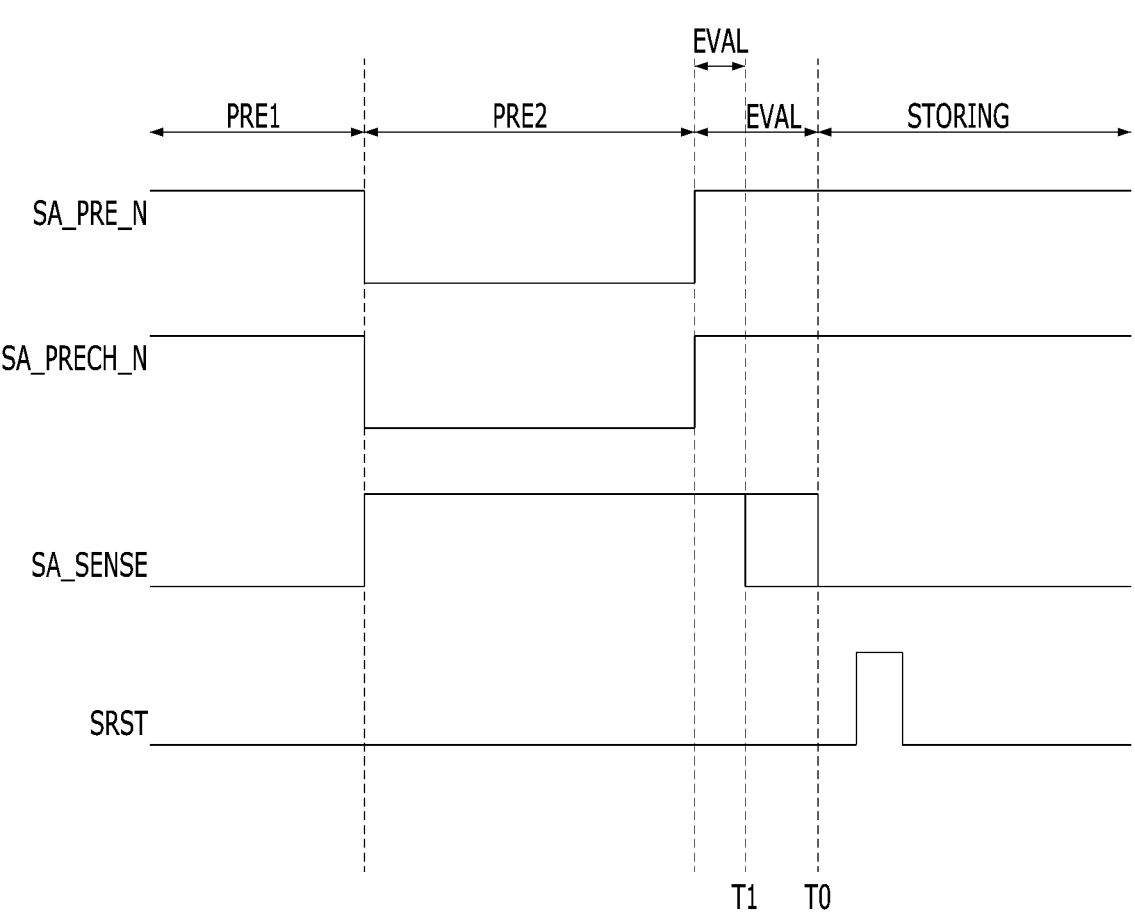
FIG. 11 is a timing diagram for describing an operation of a page buffer of FIG. 10 in accordance with an embodiment of the present disclosure.

FIG. 11 is a timing diagram for describing the operation of the page buffer PB of FIG. 10 in accordance with an embodiment of the present disclosure.

Referring to FIG. 10 and FIG. 11, the sensing operation of the page buffer PB may include a first precharge period PRE1, a second precharge period PRE2, an evaluation period EVAL, and a data storage period STORING.

During the first precharge period PRE1, the bit line BL may be precharged. In an example, the first precharge signal SA_PRE_N having a high level may be applied to the fifth switch S5, the second precharge signal SA_PRECH_N having a high level may be applied to the eighth switch S8, and the sensing signal SA_SENSE having a low level may be applied to the ninth switch S9. Due to this, the fifth switch S5, the eighth switch S8, and the ninth switch S9 may be turned off. The bit line bias signal BL_BIAS having a high level may be applied to the sixteenth switch S16 to turn on the sixteenth switch S16. Due to this, the bit line BL may be precharged with the external voltage VEXT_PB.

During the second precharge period PRE2, the first sensing node CSO and the second sensing node SO may be precharged. In an example, the first precharge signal SA_PRE_N having a low level may be applied to the fifth switch S5, the second precharge signal SA_PRECH_N having a low level may be applied to the eighth switch S8, and the sensing signal SA_SENSE having a high level may be applied to the ninth switch S9. Due to this, the fifth switch S5, the eighth switch S8, and the ninth switch S9 may be turned on, and the first sensing node CSO and the second sensing node SO may be precharged with the core voltage VCORE.

During the evaluation period EVAL, the bit line BL and the first sensing node CSO may be connected to each other. In an example, the bit line select signal SELBL having a high level may be applied to the first switch S1 and the page buffer sensing signal PBSENSE having a high level may be applied to the third switch S3. Due to this, the first switch S1 and the third switch S3 may be turned on, and the bit line BL and the first sensing node CSO may be connected to each other. In an example, the first precharge signal SA_PRE_N having a high level may be applied to the fifth switch S5, and the second precharge signal SA_PRECH_N having a high level may be applied to the eighth switch S8. Due to this, the fifth switch S5 and the eighth switch S8 may be turned off. The sensing signal SA_SENSE having a high level may be applied to the ninth switch S9. Due to this, the ninth switch S9 may be turned on, and the first sensing node CSO and the second sensing node SO may be connected to each other. Due to this, a current path CP passing through the first switch S1, the third switch S3, and the ninth switch S9 may be formed.

During the evaluation period EVAL, the voltage of the first sensing node CSO may be changed or maintained according to a threshold voltage of a memory cell connected to the bit line BL. When the threshold voltage of the memory cell is lower than the read voltage, the memory cell may turned on and a current path CP through the bit line BL may formed, so that the voltage of the second sensing node SO may be reduced. When the threshold voltage of the memory cell is higher than the read voltage, the memory cell may be turned off, so that the current path CP through the bit line BL may not be formed and the voltage of the second sensing node SO may be maintained. When the high level of the sensing signal SA_SENSE transitions to a low level, the sensing transistor STR may be turned off and the evaluation period EVAL may be terminated.

The length of the evaluation period EVAL may vary depending on whether the page buffer PB corresponds to the small memory strings SMS or the large memory strings LMS. When the page buffer PB corresponds to the small memory strings SMS, the length of the evaluation period EVAL may be increased so that the current path CP through the bit line BL may be formed for a sufficiently long time. In this case, the sensing transistor STR may be turned off at a first time point TO. When the page buffer PB corresponds to the large memory strings LMS, the length of the evaluation period EVAL may be increased so that current flowing through the current path CP is reduced. The sensing transistor STR may be turned off at a second time point T1 earlier than the first time point TO. By advancing the turn-off time point, the length of the evaluation period EVAL may be reduced and the flow of current may be reduced.

During the data storage period STORING, a result of sensing the memory cell may be stored in the latch LAT. The voltage level of the second sensing node SO may be maintained or decreased according to the voltage level of the memory cell connected to the bit line BL. The fifteenth switch S15 may be turned on or off in response to the voltage level of the second sensing node SO. The twelfth switch S12 may be controlled in response to the sensing reset signal SRST. When the twelfth switch S12 and the fifteenth switch S15 are turned on, the current path CP is formed to the ground, so that the value of the first node QS may be inverted. Accordingly, the second node QS_N may also be inverted.

According to the operation described above, the length of the evaluation period may vary depending on whether the page buffer PB corresponds to the small memory strings SMS or the large memory strings LMS. When one drain select transistor is turned on, the sensing transistor STR may be turned off at the first time point TO. When two drain select transistors are turned on, the sensing transistor STR may be turned off at the second time point T1 earlier than the first time point TO. Consequently, even though the amount of cell current varies depending on the difference in the size of the memory string, it can be compensated for by changing the length of the evaluation period, so that the sensing operation of the page buffer PB can be improved.

Although embodiments according to the technical idea of the present disclosure have been described above with reference to the accompanying drawings, this is only for describing the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure. Furthermore, the embodiments may be combined to form additional embodiments.

What is claimed is:

1. A memory comprising:
a first memory block including a plurality of first memory cells; and
a second memory block including a plurality of second memory cells each having a size larger than each of the plurality of first memory cells,
wherein each of the first memory cells is configured to store more bits per cell than each of the second memory cells, and
wherein normal data is stored in the first memory block, and critical data requiring reliability is stored in the second memory block.

2. The memory of claim 1, wherein the critical data includes one or more of buffer data, meta data, boot data, and setting data.

3. The memory of claim 1, wherein the first memory block includes first memory strings including the first memory cells, the first memory strings each having a first area, and
wherein the second memory block includes second memory strings including the second memory cells, the second memory strings each having a second area.

4. The memory of claim 3, wherein shapes of the first memory strings are different from shapes of the second memory strings.

5. The memory of claim 3, wherein the first memory block further includes first gate structures each including one or more first select lines and a plurality of first word lines, and wherein each of the first gate structures includes a first opening and a pair of the first memory strings, located in the first opening.

6. The memory of claim 5, wherein the second memory block further includes second gate structures each including one or more second select lines and a plurality of second word lines, and wherein each of the second gate structures includes a second opening and the one second memory string, located in the second opening.

7. The memory of claim 6, wherein an activation voltage level of at least one of the first select lines is different from an activation voltage level of at least one of the second select lines.

8. The memory of claim 6, wherein at least one of the first select lines is overdriven when activated, wherein at least one of the second select lines is overdriven when activated, and wherein an overdriving voltage level of at least one of the first select lines is different from an overdriving voltage level of at least one of the second select lines.

9. The memory of claim 6, wherein at least one of the first select lines is overdriven when activated, wherein at least one of the second select lines is overdriven when activated, and wherein a length of an overdriving period of at least one of the first select lines is different from a length of an overdriving period of at least one of the second select lines.

10. The memory of claim 6, wherein a size of a first pass transistor for driving at least one of the first select lines is different from a size of a second pass transistor for driving at least one of the second select lines.

11. The memory of claim 8, wherein at least one of the first select lines is a drain select line and at least one of the second select lines is a drain select line.

12. A memory comprising:

first memory strings each including a plurality of first memory cells;

second memory strings including a plurality of second memory cells each having a size larger than each of the plurality of first memory cells;

first bit lines connected to the first memory strings; and second bit lines connected to the second memory strings, wherein each of the first memory cells is configured to store more bits per cell than each of the second memory cells, and wherein during a read operation, voltage levels of the first bit lines and voltage levels of the second bit lines are differently controlled.

13. The memory of claim 12, wherein a pair of the first memory strings and one of the second memory strings are arranged to intersect each other in a zig-zag manner within one memory block.

14. The memory of claim 12, wherein during the read operation, precharge voltage levels of the first bit lines are different from precharge voltage levels of the second bit lines.

15. The memory of claim 12, wherein during the read operation, a length of an evaluation period in which the first bit lines are connected to first sensing nodes is different from a length of an evaluation period in which the second bit lines are connected to second sensing nodes.

16. A memory comprising:

a memory cell array including a first memory block and a second memory block, the first memory block including a plurality of first memory cells having a first string structure, the second memory block including a plurality of second memory cells having a second string structure different from the first string structure; and a control logic configured to:

store normal data in the first memory block, and store critical data in the second memory block, the reliability of the critical data being greater than that of the normal data, wherein each of the first memory cells having a size smaller than each of the plurality of second memory cells is configured to store more bits per cell than each of the second memory cells.

17. The memory of claim 16, wherein the first memory cells and the second memory cells are arranged in a zig-zag pattern.

18. The memory of claim 16, wherein the critical data includes at least one of meta data, boot data, setting data and buffer data.

* * * * *